United States Patent
Yamagami

(10) Patent No.: US 9,520,176 B2
(45) Date of Patent: Dec. 13, 2016

(54) SEMICONDUCTOR MEMORY DEVICE INCLUDING POWER SUPPLY LINE

(71) Applicant: Micron Technology, Inc., Boise, ID (US)

(72) Inventor: Minoru Yamagami, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/690,858

(22) Filed: Apr. 20, 2015

(65) Prior Publication Data

US 2015/0310907 A1 Oct. 29, 2015

(30) Foreign Application Priority Data

Apr. 23, 2014 (JP) ................. 2014-088961

(51) Int. Cl.
| | |
|---|---|
| *G11C 5/06* | (2006.01) |
| *G11C 11/4074* | (2006.01) |
| *G11C 11/4091* | (2006.01) |
| *G11C 11/4096* | (2006.01) |
| *G11C 11/4097* | (2006.01) |

(52) U.S. Cl.
CPC .......... *G11C 11/4074* (2013.01); *G11C 5/063* (2013.01); *G11C 11/4091* (2013.01); *G11C 11/4096* (2013.01); *G11C 11/4097* (2013.01)

(58) Field of Classification Search
CPC ............. G11C 11/401; G11C 11/40615; G11C 29/028; G11C 11/406; G11C 29/025; G11C 29/12; G11C 29/50008; G11C 29/883; G11C 5/04; G11C 8/12; G11C 11/40; G11C 11/4072; G11C 11/4097; G11C 29/08
USPC ... 365/201, 222, 51, 63, 233.1, 189.05, 191, 365/194, 203, 230.03, 233.13, 236, 52
See application file for complete search history.

(56) References Cited

U.S. PATENT DOCUMENTS

| | | | |
|---|---|---|---|
| 8,879,297 B2 | 11/2014 | Egawa | |
| 2012/0112354 A1* | 5/2012 | Hirano | H01L 23/522 257/773 |
| 2013/0082404 A1* | 4/2013 | Kajigaya | H01L 23/498 257/777 |

FOREIGN PATENT DOCUMENTS

JP 2013-131615 7/2013

* cited by examiner

*Primary Examiner* — Thong Q Le
(74) *Attorney, Agent, or Firm* — Wells St. John P.S.

(57) ABSTRACT

A semiconductor apparatus disclosed in this disclosure includes a first channel formed in a first area and including a first power supply pad, a first clock pad, a first command address pad, a first data input/output pad and a first memory cell array; a second channel formed in a second area and including a second power supply pad, a second clock pad, a second command address pad, a second data input/output pad and a second memory cell array, the first and second channels being independently controllable from each other; and mesh structure lines straddling the first area and second area and connected to the first and second power supply pads.

12 Claims, 7 Drawing Sheets

SEMICONDUCTOR MEMORY DEVICE INCLUDING POWER SUPPLY LINE

RELATED PATENT DATA

This application is based upon and claims the benefit of priority from Japanese Patent Application No. 2014-088961 filed on Apr. 23, 2014, the disclosure of which is incorporated herein in its entirely by reference.

FIELD OF INVENTION

The present invention relates to a semiconductor device and particularly relates to a semiconductor device including power supply lines for enhancing power supply.

DESCRIPTION OF THE RELATED ART

Most DRAMs (Dynamic Random Access Memories), which are typical semiconductor devices, have a center-pad type layout in which pads are arranged in the center of a chip. Meanwhile, patent document 1 (Japanese Laid-Open Patent Publication No. 2013-131615) describes a semiconductor device having an edge-pad type layout in which pads are arranged along the edge of a chip.

SUMMARY

Disclosure of the above-identified Patent Literature is incorporated herein by reference. The above analysis has been made by the inventors of the present invention.

According to a first aspect of the present invention, there is provided a semiconductor device including:
a plurality of first pads including a first power supply pad and a first data input/output pad, the plurality of first pads aligned to a first line elongated in a first direction;
a plurality of second pads including a second power supply pad and a second data input/output pad, the plurality of second pads aligned to a second line elongated in the first direction;
a first and second memory cell arrays arranged between the plurality of first pads and the plurality of second pads in a second direction crossing the first direction;
a first main amplifier arranged between the first memory cell array and the plurality of first pads;
a second main amplifier arranged between the second memory cell array and the plurality of second pads;
a first data input/output circuit coupled between the first data input/output pad and the first main amplifier;
a second data input/output circuit coupled between the second data input/output pad and the second main amplifier;
a first signal line coupled between the first main amplifier and the first data input/output circuit;
a second signal line coupled between the second main amplifier and the second data input/output circuit; and
a first power supply line arranged between the first and second main amplifiers and coupled to the first and second power supply pads.

According to another aspect of the present invention, there is provided a semiconductor apparatus including:
a first channel formed in the first area and including a first power supply pad,
a first clock pad, a first command address pad, a first data input/output pad and a first memory cell array;
a second channel formed in the second area and including a second power supply pad, a second clock pad, a second command address pad, a second data input/output pad and a second memory cell array, the first and second channels being independently controllable from each other; and
mesh structure lines straddling the first area and second area and connected to the first and second power supply pads.

EMBODIMENTS

Preferred embodiments of the present invention will now be described in detail with reference to the accompanying drawings.

Figure 1:
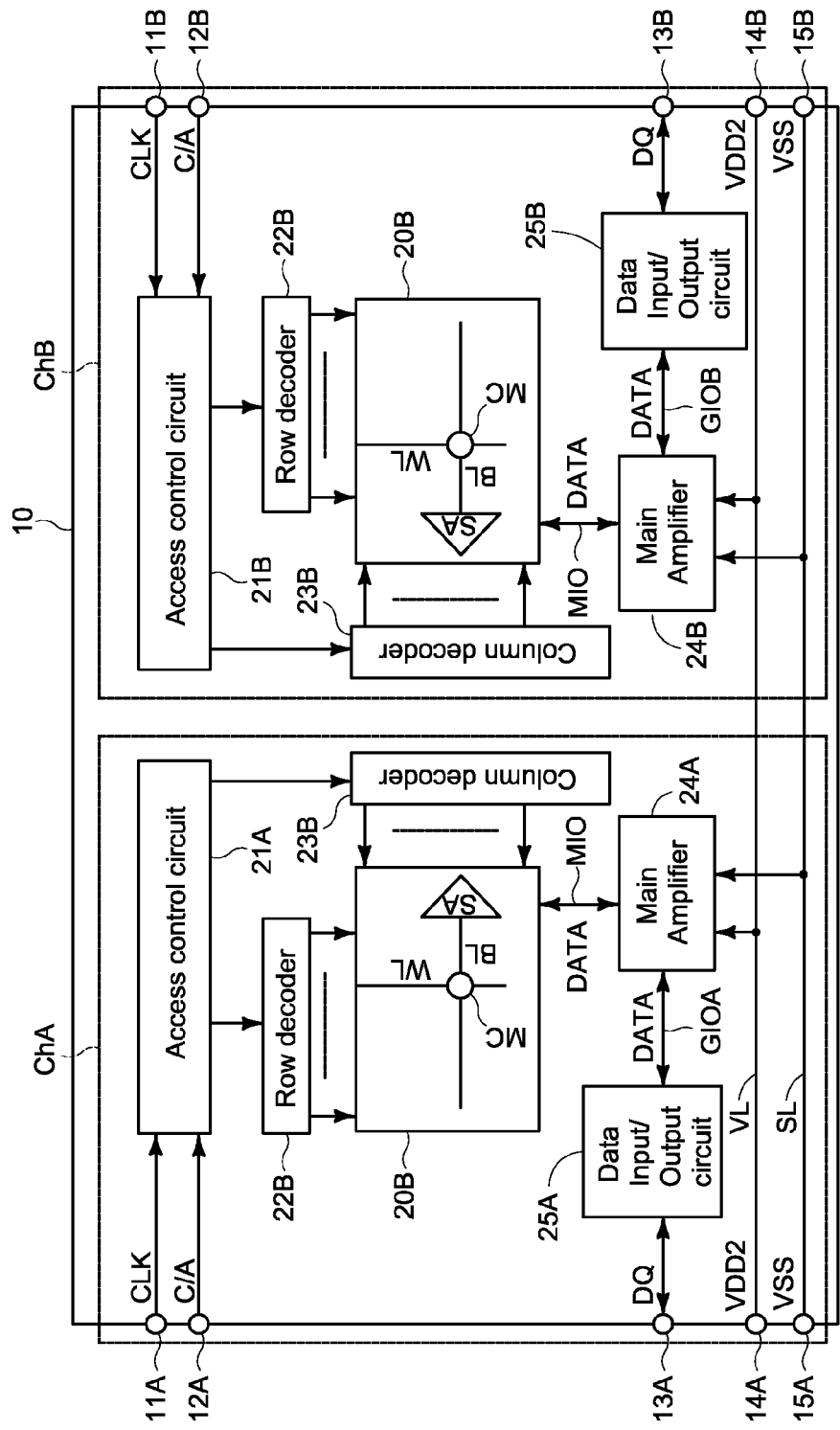
FIG. 1 is a block diagram of a configuration of a semiconductor device 10 according to a preferred embodiment of the present invention.

FIG. 1 is a block diagram of a configuration of a semiconductor device 10 according to a preferred embodiment of the present invention.

The semiconductor device 10 according to this embodiment is a DDR 4 (Double Data Rate 4) DRAM packaged on a single semiconductor substrate, and includes two channels ChA and ChB, as shown in FIG. 1. The channels ChA and ChB are capable of operating independently to each other, and include external terminals assigned in correspondence to the channels ChA and ChB, respectively. Specifically, a clock pad 11A, a command address pad 12A, and a data input/output pad 13A are assigned to the channel ChA, while a clock pad 11B, a command address pad 12B, and a data input/output pad 13B are assigned to the channel ChB.

The clock pads 11A and 11B are terminals to which an external clock signal CLK is input. The command address pads 12A and 12B are terminals to which an external command address signal C/A is input. The clock signal CLK and the command address signal C/A are supplied to access control circuits 21A and 21B included in the channels ChA and ChB, respectively.

The access control circuit 21A included in the channel ChA is a circuit that executes an operation of accessing a memory cell array 20A. The access control circuit 21A supplies an address signal input to the command address pad 12A that represents a row address, to a row decoder 22A, while supplies an address signal input to the command address pad 12A that represents a column address, to a column decoder 23A. The row decoder 22A selects a word line WL included in the memory cell array 20A, based on a row address. The column decoder 23A selects a bit line BL included in the memory cell array 20A, based on a column address.

A memory cell MC is disposed at the intersection of the word line WL and the bit line BL. Data DATA read out of the memory cell MC during a read operation is supplied to a main amplifier 24A serving as a first amplifying circuit, via a sense amplifier SA. The main amplifier 24A amplifies the read data DATA and transfers the amplified read data DATA to a data input/output circuit 25A via a global signal line GIOA. Based on the transferred data DATA, the data input/output circuit 25A outputs read data DQ from the data input/output pad 13A to outside of the semiconductor device 10.

During a write operation, external write data DQ is input to the data input/output pad 13A. The write data DQ supplied to the data input/output circuit 25A is transferred to the main amplifier 24A via the global signal line GIOA. The main amplifier 24A supplies the transferred data DATA (DQ) to the sense amplifier SA. As a result, the data DATA is written to the selected memory cell MC.

The access control circuit 21B included in the channel ChB is a circuit that executes an operation of accessing a memory cell array 20B. The access control circuit 21B supplies an address signal input to the command address pad 12B that represents a row address, to a row decoder 22B, while supplies an address signal input to the command address pad 12B that represents a column address, to a column decoder 23B. The row decoder 22B selects a word line WL included in the memory cell array 20B, based on a row address. The column decoder 23B selects a bit line BL included in the memory cell array 20B, based on a column address.

A memory cell MC is disposed at the intersection of the word line WL and the bit line BL. Data DATA read out of the memory cell MC during a read operation is supplied to a main amplifier 24B serving as a second amplifying circuit, via a sense amplifier SA. The main amplifier 24B amplifies the read data DATA and transfers the amplified read data DATA to a data input/output circuit 25B via a global signal line GIOB. Based on the transferred data DATA, the data input/output circuit 25B outputs read data DQ from the data input/output pad 13B to outside of the semiconductor device 10.

During a write operation, external write data DQ is input to the data input/output pad 13B. The write data DQ supplied to the data input/output circuit 25B is transferred to the main amplifier 24B via the global signal line GIOB. The main amplifier 24B supplies the transferred data DATA to the sense amplifier SA. As a result, the data DATA is written to the selected memory cell MC.

The semiconductor device 10 also includes power supply pads 14A, 14B, 15A, and 15B. The power supply pads 14A and 14B are terminals supplied with a source voltage VDD2, and the power supply pads 15A and 15B are terminals supplied with a source voltage VSS. The power supply pads 14A and 15A are assigned to the channel ChA, and the power supply pads 14B and 15B are assigned to the channel ChB. However, the power supply pads 14A and 14B are connected to each other via the power supply line VL, while the power supply pads 15A and 15B are connected to each other via the power supply line SL. In other words, the channels ChA and ChB are not independent of each other in terms of power supply and are short-circuited inside the semiconductor device 10.

The semiconductor device 10 further includes other power supply circuits that generate internal voltages (e.g., an internal voltage VARY) and power supply pads assigned as dedicated pads to the data input/output circuits 25A and 25B. These power supply circuits and power supply pads are not depicted in FIG. 1.

Figure 2:
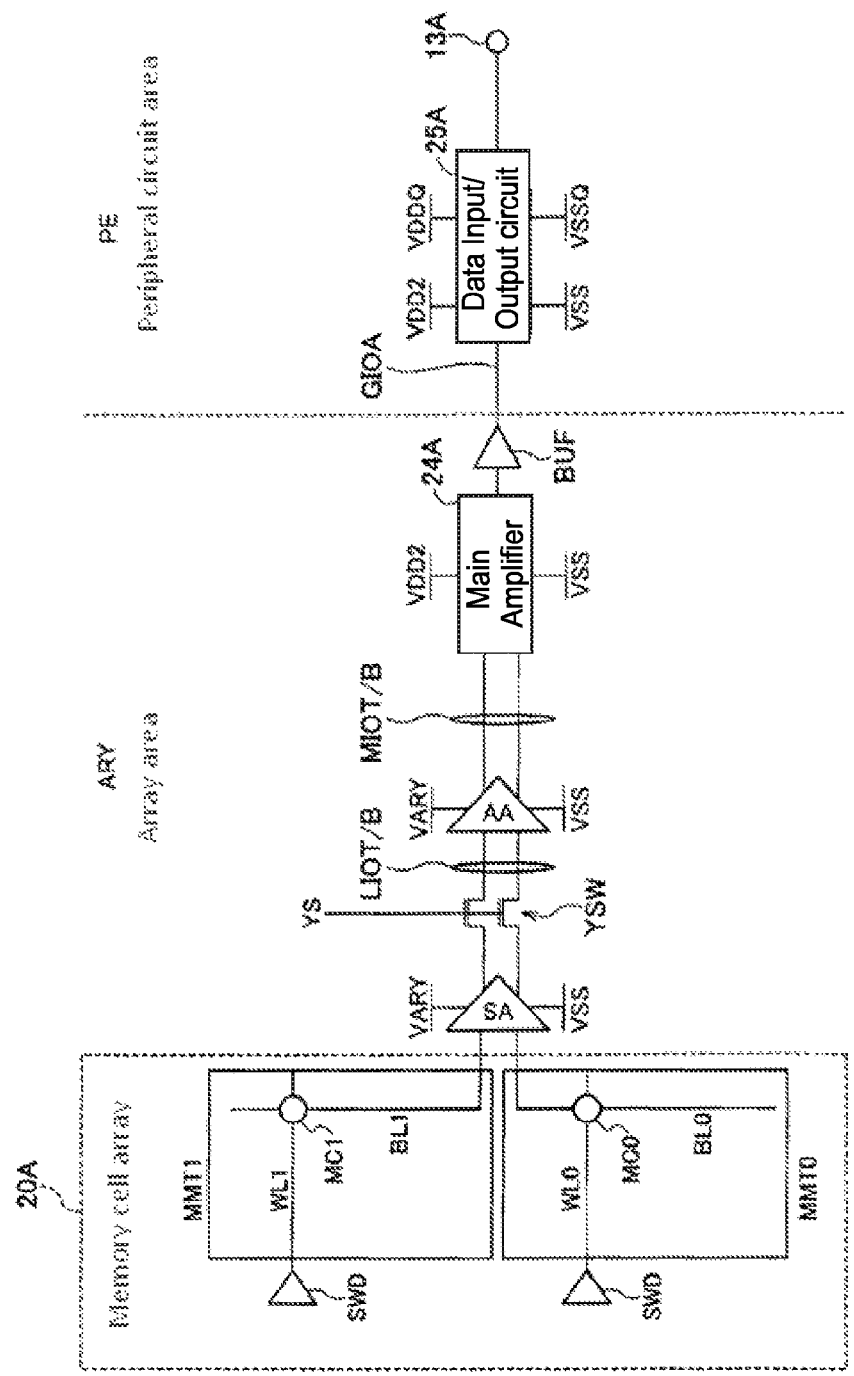
FIG. 2 is a diagrammatical view of a signal route leading from a memory cell MC to a data input/output pad 13A.

FIG. 2 is a diagrammatical view of a signal route leading from the memory cell MC to the data input/output pad 13A.

As shown in FIG. 2, the memory cell array 20A is divided into multiple memory mats MMT including memory mats MMT0 and MMT1. Each memory mat MMT is defined as a range in which the word line WL and the bit line BL extend. FIG. 2 depicts a word line WL0, a bit line BL0, and a memory cell MC0 disposed at their intersection, which are included in a memory mat MMT0, and a word line WL1, a bit line BL1, and a memory cell MC1 disposed at their intersection, which are included in a memory mat MMT1. The memory mat MMT and the word line WL are selected by the row decoder 22A, based on a row address. The word line WL is driven by a word driver SWD.

The bit lines BL0 and BL1 are connected to the same sense amplifier SA. As a result, a potential difference created between the bit lines BL0 and BL1 is amplified by the sense amplifier SA. Two bit lines BL belonging to two different memory mats are connected to the same sense amplifier SA in such a manner for the reason that the semiconductor device 10 of this embodiment has a so-called open bit line structure. However, the semiconductor device of the present invention is not limited to the semiconductor device having the open bit line structure.

The sense amplifier SA is connected to complementary local signal lines LIOT/LIOB via a column switch YSW. The column switch YSW is controlled by a column selection signal YS, which is generated by the column decoder 23A based on a column address. The complementary local signal lines LIOT/LIOB are connected to complementary main signal lines MIOT/MIOB via an assist amplifier AA. The sense amplifier SA and the assist amplifier AA are supplied with an internal voltage VARY serving as a source voltage. The internal voltage VARY is a voltage generated by a power supply circuit (not depicted).

The complementary main signal lines MIOT/MIOB are connected to the main amplifier 24A. The main amplifier 24A converts complementary data DATA supplied thereto via the complementary main signal lines MIOT/MIOB, into single-end format data and transfers it to the global signal line GIOA, which has an intermediate buffer BUF inserted therein for the reason that the global signal line GIOA is a long distance line having a large load capacity. The main amplifier 24A is supplied with the source voltage VDD2 serving as an operating voltage.

The global signal line GIOA is connected to the data input/output circuit 25A. The data input/output circuit 25A performs parallel/serial conversion of the data DATA transferred thereto via the global signal line GIOA, and outputs the converted serial data DATA from the data input/output pad 13A to outside of the semiconductor device 10. The data input/output circuit 25A mainly uses the source voltage VDD2 as an operating voltage but uses dedicated source voltages VDDQ and VSSQ at an output stage that drives the data input/output pad 13A. Separate source voltages are used in this manner in order to prevent propagation of power noise generated at the output stage to other circuits.

A section between the memory cell array 20A and the main amplifier 24A is disposed in a so-called array region ARY. The data input/output circuit 25A and the data input/output pad 13A are disposed in a peripheral circuit region PE different from the array region. The global signal line GIOA thus serves as a long distance line connecting the array region ARY to the peripheral circuit region PE.

A layout of the array region ARY and the peripheral circuit region PE will then be described in detail.

Figure 3:
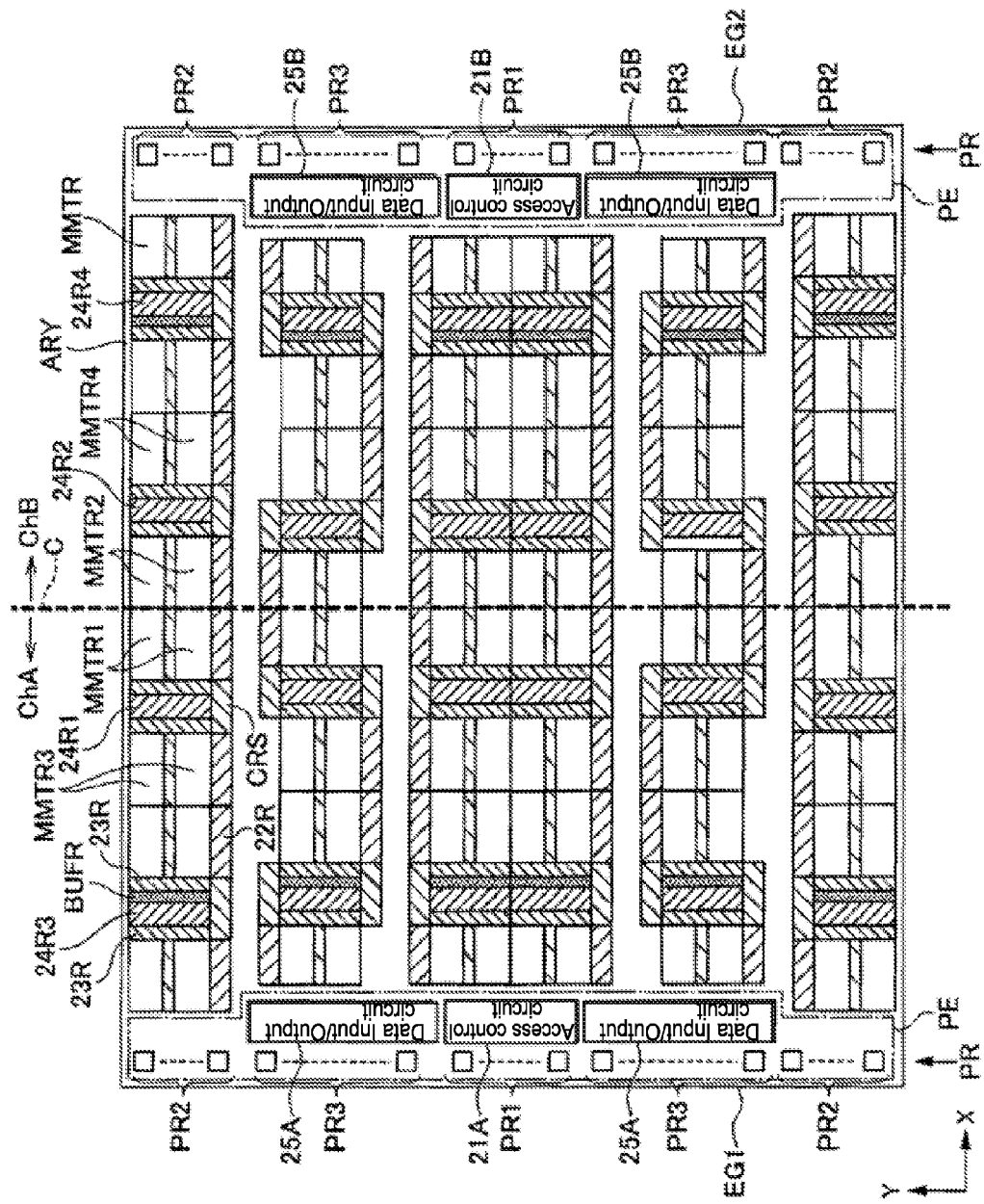
FIG. 3 is a plan view for explaining a layout of the semiconductor device 10.

FIG. 3 is a plan view for explaining a layout of the semiconductor device 10.

As shown in FIG. 3, the semiconductor device 10 is a rectangular chip, in which peripheral circuit regions PE are arranged along edges EG1 and EG2 located on both sides in the X direction (second direction) of the chip, respectively. The peripheral circuit region PE disposed along the edge EG1 belongs to the channel ChA, while the peripheral circuit region PE disposed along the edge EG2 belongs to the channel ChB. The region sandwiched between these peripheral circuit regions PE is the array region ARY. The array region ARY is divided into the channel ChA and the channel ChB along a boundary represented by a center line C dividing the chip into two in the X direction. Hence one side (left side) demarcated by the central line C makes up the channel ChA, while the other side (right side) demarcated by the central line C makes up the channel ChB.

Most of the array region ARY is composed of mat regions MMTR in which multiple memory mats MMT are arranged. In the mat regions MMTR, sense amplifiers SA, word drivers SWD, assist amplifiers AA, etc., are also arranged. On a side of each mat region MMTR in the Y direction (first direction), a row decoder region 22R is formed, in which the row decoder 22A or 22B is disposed. On a side of each mat region MMTR in the X direction, a column decoder region 23R is formed, in which the column decoder 23A or 23B is disposed. One memory mat region MMTR is divided into two portions in the Y direction, and between these two portions, an array control region ARYCTR is formed, in which circuit that controls the assist amplifier AA is disposed.

Between each set of column decoder regions 23R adjacent to each other in the X direction, each main amplifier region 24R is formed, in which the main amplifier 24A or 24B is disposed. One main amplifier region 24R includes the main amplifier 24A or 24B corresponding to the memory mat region MMTR on one side (left side) in the X direction and the main amplifier 24A or 24B corresponding to the memory mat region MMTR on the other side (right side) in the X direction such that both main amplifier 24A or 24B are arranged together in the main amplifier region 24R. For example, in a main amplifier region 24R1 that is a second region, the main amplifier 24A corresponding to a memory mat region MMTR1 and the main amplifier 24A corresponding to a memory mat region MMTR3 are arranged. Similarly, in a main amplifier region 24R2 that is a third region, the main amplifier 24B corresponding to a memory mat region MMTR2 and the main amplifier 24B corresponding to a memory mat region MMTR4 are arranged. A memory mat MMT disposed in the memory mat region MMTR1 is equivalent to a first memory cell array, and a memory mat MMT disposed in the memory mat region MMTR2 is equivalent to a second memory cell array.

On a side in the X direction of a main amplifier region 24R3 closer to the edge EG1 and on a side in the X direction of a main amplifier region 24R4 closer to the edge EG2, a buffer region BUFR is formed, in which an intermediate buffer BUF is disposed. On a side in the Y direction of the main amplifier region 24R and column decoder region 23R, a buffer region CRSR is formed, in which an intermediate buffer CRS that mainly relays a row address and a column address is disposed.

The peripheral circuit regions PE have their respective pad regions PR extending along the edges EG1 and EG2. In the pad region PR along the edge EG1, multiple pads assigned to the channel ChA are arranged, which pads include the clock pad 11A, the command address pad 12A, the data input/output pad 13A, and the power supply pads 14A and 15A. Similarly, in the pad region PR along the edge EG2, multiple pads assigned to the channel ChB are arranged, which pads include the clock pad 11B, the command address pad 12B, the data input/output pad 13B, and the power supply pads 14B and 15B.

The pad region PR is divided into several areas, i.e, subregions. In a subregion PR1 located at the center in the Y direction, the clock pads 11A and 11B, the command address pads 12A and 12B, and some of the power supply pads 14A, 14B, 15A, and 15B are arranged. In subregions PR2 located on both sides in the Y direction, some of the power supply pads 14A, 14B, 15A, and 15B are arranged. In subregions PR3 located between the subregion PR1 and the subregions PR2, the data input/output pads 13A and 13B and the rest of the power supply pads 14A, 14B, 15A, and 15B are arranged.

As shown in FIG. 3, in the peripheral circuit regions PE, the access control circuits 21A and 21B are disposed respectively in the regions adjacent to the subregions PR1 of the pad regions PR, and the data input/output circuits 25A and 25B are disposed respectively in the regions adjacent to the subregions PR3 of the pad regions PR.

Figure 4:
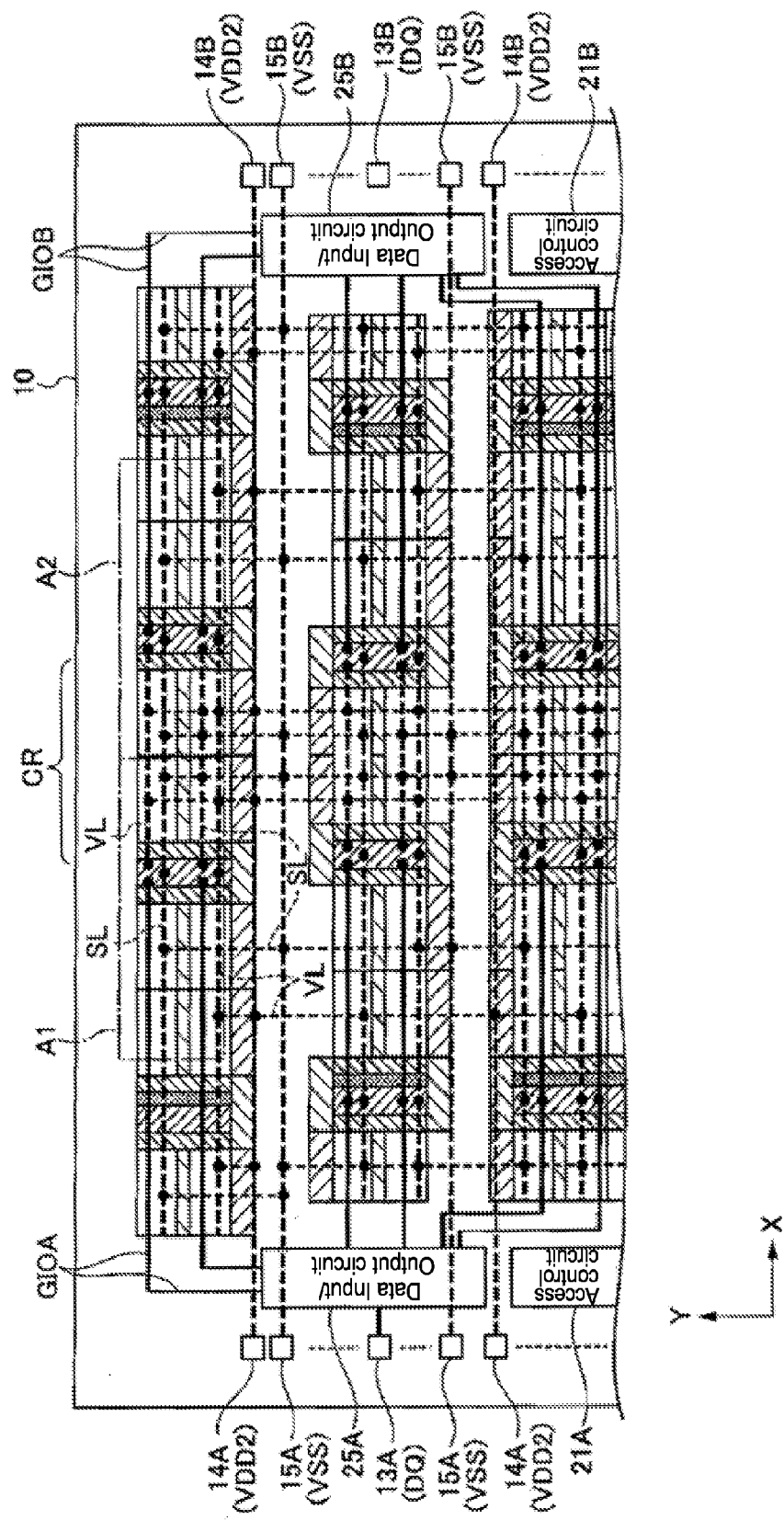
FIG. 4 is a diagrammatical view for explaining global signal lines GIOA and GIOB and power supply lines VL and SL included in the semiconductor device 10.

FIG. 4 is a diagrammatical view for explaining the global signal lines GIOA and GIOB and power supply lines VL and SL included in the semiconductor device 10.

Figure 5:
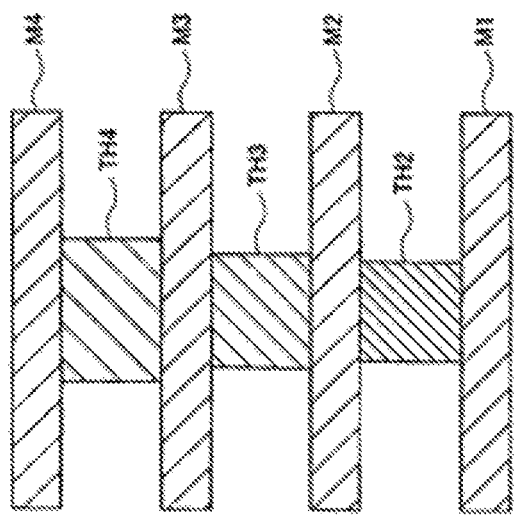
FIG. 5 is a sectional view for explaining the structure of line layers M1 to M4.

FIG. 4 depicts the global signal lines GIOA and GIOB and power supply lines VL and SL arranged in the half area of the semiconductor device 10. The semiconductor device 10 of this embodiment includes four interconnect layers M1 to M4 serving as upper layer interconnects, as shown in FIG. 5 (this interconnect layer structure does not place a structural limit on the semiconductor device 10). FIG. 4 depicts lines formed on the interconnect layers M3 and M4 among the interconnect layers M1 to M4. The interconnect layer M1 includes copper (Cu) lines formed thereon and the interconnect layers M2 to M4 include aluminum (Al) lines formed thereon (this line structure does not place a structural limit on the semiconductor device 10). The lines formed on the interconnect layers M1 to M4 are interconnected via through-hole conductors TH2 to TH4.

In FIG. 4, the global signal lines GIOA and GIOB are represented by continuous lines and the power supply lines VL and SL are represented by broken lines. The part of global signal lines GIOA and GIOB and power supply lines VL and SL that extend in the X direction is formed on the interconnect layer M4, while the part of the same extending in the Y direction is formed on the interconnect layer M3. The lines formed on the interconnect layer M3 and the lines formed on the interconnect layer M4 that correspond to each other are short-circuited via the though-hole conductors TH4 shown in FIG. 5. In FIG. 4, the though-hole conductors TH4 are located in places represented by black circles.

The first global signal line GIOA is so formed in the array region ARY of the channel ChA that the first global signal line GIOA connects the data input/output circuit 25A to the main amplifier 24A. Because the global signal line GIOA is the line assigned to the channel ChA, the global signal line GIOA is not formed on the array region ARY in the channel ChB.

Similarly, the second global signal line GIOB is so formed in the array region ARY of the channel ChB that the second global signal line GIOB connects the data input/output circuit 25B to the main amplifier 24B. Because the global signal line GIOB is the line assigned to the channel ChB, the global signal line GIOB is not formed on the array region ARY in the channel ChA.

The power supply line VL is formed to extend across the array region ARY so that the power supply line VL connects the power supply pad 14A assigned to the channel ChA to the power supply pad 14B assigned to the channel ChB. The part of power supply line VL that is formed on the interconnect layer M4, i.e., the part of power supply line VL that extends in the X direction is located such that the coordinates of the part of the power supply line VL is shifted in the Y direction to prevent the part of the power supply line VL from interfering with the global signal lines GIOA and GIOB. However, in a first region CR where the global signal lines GIOA and GIOB are not present, the power supply line VL is located on extension lines from the global signal lines GIOA and GIOB.

Similarly, the power supply line SL is formed to extend across the array region ARY so that the power supply line SL connects the power supply pad 15A assigned to the channel ChA to the power supply pad 15B assigned to the channel ChB. The part of power supply line SL that is formed on the interconnect layer M4, i.e., the part of power supply line SL that extends in the X direction is located such that the coordinates of the part of the power supply line SL is shifted in the Y direction to prevent the part of the power supply line SL from interfering with the global signal lines GIOA and GIOB. However, in the region CR where the global signal lines GIOA and GIOB are not present, the power supply line SL is located on extension lines from the global signal lines GIOA and GIOB.

The region CR is the region above the memory mat regions MMTR closest to the center line C representing the boundary between the channel ChA and the channel ChB. More exactly, it is the region between the main amplifier 24A closest to the center line C among main amplifiers 24A belonging to the channel ChA and the main amplifier 24B closest to the center line C among main amplifiers 24B belonging to the channel ChB. Therefore, the area above the column decoder regions 23R corresponding to the memory mat regions MMTR is also included in the region CR.

The global signal lines GIOA and GIOB are not formed in the region CR for the following reasons. It is understood by turning attention to the memory mat region MMTR1 belonging to the channel ChA that data read out of the memory mat region MMTR1 is amplified by the main amplifier 24A disposed in the main amplifier region 24R1 and then is transferred through the global signal line GIOA. This means that the main amplifier region 24R1 is equivalent to an end of the global signal line GIOA. It is therefore unnecessary to form the global signal line GIOA above the memory mat region MMTR1.

Similarly, it is understood by turning attention to the memory mat region MMTR2 belonging to the channel ChB that data read out of the memory mat region MMTR2 is amplified by the main amplifier 24B disposed in the main amplifier region 24R2 and then is transferred through the global signal line GIOB. This means that the main amplifier region 24R2 is equivalent to an end of the global signal line GIOB. It is therefore unnecessary to form the global signal line GIOB above the memory mat region MMTR2.

For the above reasons, the global signal lines GIOA and GIOB are not formed in the region CR above the memory mat regions MMTR1 and MMTR2. According to this embodiment, in the region CR, the power supply lines VL and SL are formed on extension lines from the global signal lines GIOA and GIOB to enhance power supply on the central part of the chip.

The main amplifier regions 24R1 and 24R2 are more distant from the edges EG1 and EG2 than the main amplifier regions 24R3 and 24R4. This raises a concern that the main amplifiers 24A and 24B disposed in the main amplifier regions 24R1 and 24R2 may operate at lower speed. The lower operation speed of the main amplifiers 24A and 24B results because a drop in a source voltage supplied through the power supply lines VL and SL grows larger at the central part of the chip.

According to this embodiment, however, the power supply lines VL and SL arranged in the region CR located on the central part of the chip enhance power supply performance, thereby reduces the extent of a voltage drop. As a result, operation conditions for the main amplifiers 24A and 24B disposed in the main amplifier regions 24R1 and 24R2 almost match operation conditions for the main amplifiers 24A and 24B disposed in the main amplifier regions 24R3 and 24R4. This improves access speed.

Figure 6:
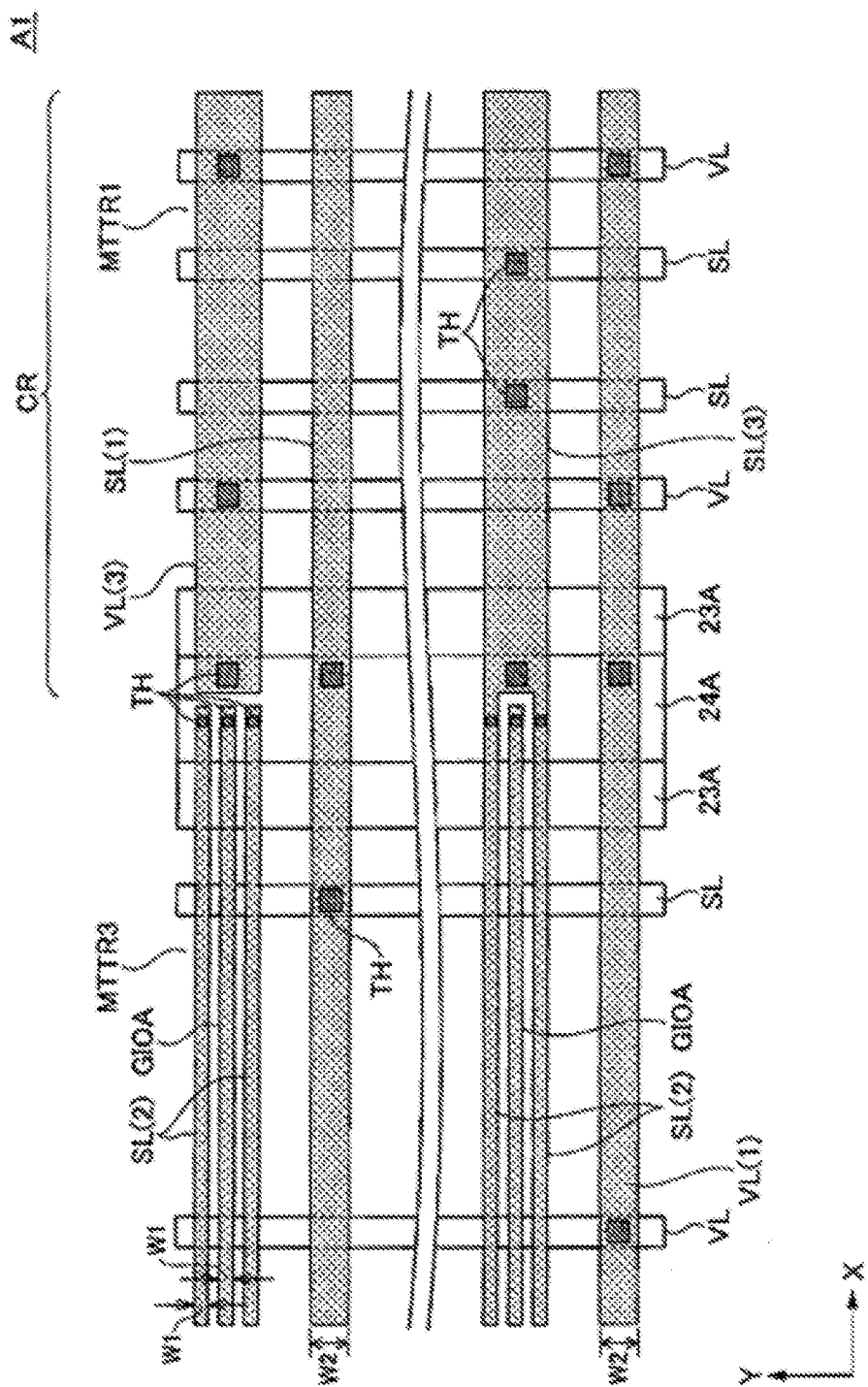
FIG. 6 is an enlarged view of a region A1 shown in FIG. 4.
Figure 7:
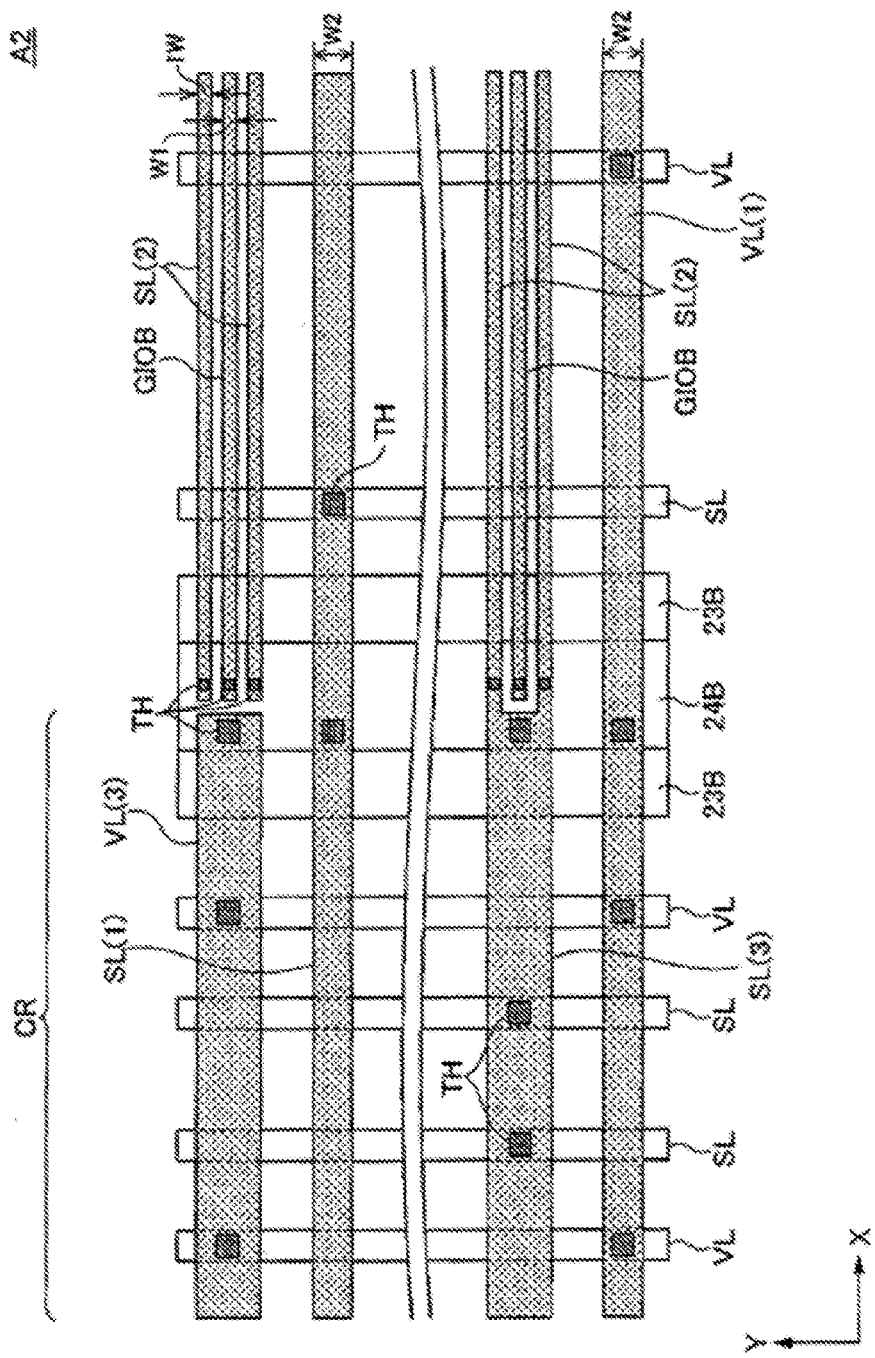
FIG. 7 is an enlarged view of a region A2 shown in FIG. 4.

FIGS. 6 and 7 are enlarged views of regions A1 and A2 shown in FIG. 4.

As shown in FIG. 6, on the part of interconnect layer M4 that is above the memory mat region MMTR3, the global signal line GIOA extends in the X direction. As shown in FIG. 7, on the part of interconnect layer M4 that is above the memory mat region MMTR4, the global signal line GIOB extends in the X direction. Each of the global signal lines GIOA and GIOB has a line width W1. On both sides of each of the global signal lines GIOA and GIOB in the Y direction, shielding power supply lines VL or SL are arranged. Each of the shielding power supply lines VL and SL also has the line width W1.

The global signal line GIOA is connected to the main amplifier 24A via a through-hole conductor TH and terminates in the area where the global signal line GIOA is connected to the main amplifier 24A. Similarly, the global signal line GIOB is connected to the main amplifier 24B via a through-hole conductor TH and terminates in the area where the global signal line GIOB is connected to the main amplifier 24B. The shielding power supply lines VL and SL are also connected to the main amplifiers 24A and 24B via through-hole conductors TH.

In an area of the interconnect layer M4 above the memory mat regions MMTR3 and MMTR4, in which area the global signal lines GIOA and GIOB are not laid, ordinary power supply lines VL and SL extend in the X direction. The ordinary power supply lines VL and SL are thicker than the shielding power supply lines VL and SL, and each have a line width W2. The power supply lines VL and SL arranged on the interconnect layer M4 are connected to the power supply lines VL and SL extending in the Y direction on the interconnect layer M3, via through-hole conductors TH. Hence the power supply lines VL and SL are built into a mesh structure.

Part of the power supply lines VL and SL do not terminate above the main amplifiers 24A and 24B but extends into the region CR. For example, a power supply line VL(1) shown in FIG. 6 extends across the region CR in the X direction while maintaining its line width W2 and is connected to a power supply line VL(1) shown in FIG. 7. Similarly, a power supply line SL(1) shown in FIG. 6 extends across the region CR in the X direction while maintaining its line width W2 and is connected to a power supply line SL(1) shown in FIG. 7. The power supply lines VL(1) and SL(1) of FIG. 6 are equivalent to respective third line portions of the power supply lines VL and SL. The power supply lines VL(1) and SL(1) of FIG. 7 are equivalent to respective fourth line portions of the power supply lines VL and SL.

Two shielding power supply lines SL(2) shown in FIG. 6 are connected to a power supply line SL(3) with the line width W2 and then to power supply lines SL(2) shown in FIG. 7. Such a layout is adopted when the Y coordinates of the shielding power supply lines SL(2) and global signal lines GIOA and GIOB sandwiched between them match the Y coordinates of the power supply line SL(3). In other words, when the power supply line SL(3) is present on an extension line in the X direction from the shielding power supply lines SL(2) and global signal lines GIOA and GIOB sandwiched between them, the shielding power supply lines SL(2) are connected directly to the power supply line SL(3).

Shielding power supply lines VL(2) (not depicted) are also connected in the same manner as described above. When a power supply line VL(3) is present on an extension line in the X direction from the shielding power supply lines VL(2) and global signal lines GIOA and GIOB sandwiched between them, the shielding power supply lines VL(2) are connected directly to the power supply line VL(3). The power supply lines VL(3) and SL(3) are equivalent to respective first line portions of the power supply lines VL and SL.

In contrast, when the power supply line VL(3) is present on an extension line in the X direction from the shielding power supply lines SL(2) and global signal lines GIOA and GIOB sandwiched between them, the shielding power supply lines SL(2) are terminated on the part where the shielding power supply lines SL(2) are connected to the main amplifier 24A. The shielding power supply lines VL(2) (not depicted) are also terminated in the same manner. When the power supply line SL(3) is present on an extension line in the X direction from the shielding power supply lines VL(2) and global signal lines GIOA and GIOB sandwiched between them, the shielding power supply lines VL(2) are terminated on the part where the shielding power supply lines VL(2) are connected to the main amplifier 24A.

In the region CR, power supply lines VL(4) and SL(4) arranged on the interconnect layer M3 are extended in the Y direction and are connected to the power supply lines VL(3) and SL(3) arranged on the interconnect layer M4, via through-hole conductors TH. The power supply lines VL(4) and SL(4) are equivalent to respective second line portions of the power supply lines VL and SL.

Such power supply lines VL(3) and SL(3) can be provided because as described above, no need for providing the global signal lines GIOA and GIOB above the region CR creates an unoccupied space on the part of interconnect layer M4 that is located on an extension line in the X direction from the global signal lines GIOA and GIOB. According to this embodiment, the power supply lines VL and SL are laid in this space to enhance power supply performance. Hence a drop in the source voltage supplied to the main amplifiers 24A and 24B located distant from the edges EG1 and EG2 can be suppressed.

The preferred embodiment of the present invention has been described above. The present invention is not limited to the above embodiment but may be modified into various forms of applications on the condition that the modification does not deviate from the substance of the invention. It is obvious that the modified forms of applications are also included in the scope of the invention.

What is claimed is:

1. A semiconductor apparatus comprising:
    a plurality of first pads including a first power supply pad and a first data input/output pad, the plurality of first pads aligned to a first line elongated in a first direction;
    a plurality of second pads including a second power supply pad and a second data input/output pad, the plurality of second pads aligned to a second line elongated in the first direction;
    first and second memory cell arrays arranged between the plurality of first pads and the plurality of second pads in a second direction crossing the first direction;
    a first main amplifier arranged between the first memory cell array and the plurality of first pads;
    a second main amplifier arranged between the second memory cell array and the plurality of second pads;
    a first data input/output circuit coupled between the first data input/output pad and the first main amplifier;
    a second data input/output circuit coupled between the second data input/output pad and the second main amplifier;
    a first signal line coupled between the first main amplifier and the first data input/output circuit;
    a second signal line coupled between the second main amplifier and the second data input/output circuit;
    a primary power supply line arranged between the first and second main amplifiers;
    wherein the first signal line extends along the second direction from an edge of the primary power supply line, and is sandwiched between a pair of shielding power supply lines that extend in the second direction along opposing surfaces of the first signal line;
    wherein a width of the primary power supply line is wider than a width of the first signal line; and
    wherein the shielding power supply lines are about the same width as the first signal line.

2. The semiconductor apparatus as claimed in claim 1, wherein the primary power supply line passes above the first and second memory cell arrays.

3. The semiconductor apparatus as claimed in claim 1, wherein the shielding power supply lines are continuous with the primary power supply line and form a container-shape along the edge of the primary power supply line, and wherein the first signal line extends into said container shape.

4. A semiconductor apparatus including a first area and a second area, comprising:
    a first channel formed in the first area and including a first power supply pad, a first clock pad, a first command address pad, a first data input/output pad and a first memory cell array;
    a second channel formed in the second area and including a second power supply pad, a second clock pad, a second command address pad, a second data input/output pad and a second memory cell array, the first and second channels being independently controllable from each other;
    mesh structure lines straddling the first area and second area and connected to the first and second power supply pads;
    wherein the first channel includes a first main input/output line connected between a first data input/output circuit coupled to the first data input/output pad and a first main amplifier coupled to the first memory cell array, and the second channel includes a second main input/output line connected between a second data input/output circuit coupled to the second data input/output pad and a second main amplifier coupled to the second memory cell array; and
    wherein a width of the first and second input/output lines is narrower than that of the mesh structure lines.

5. The semiconductor apparatus as claimed in claim 4, wherein the first channel includes a first sense amplifier amplifying data read from the first memory cell array, a first assist amplifier coupled between the first main input/output line and a first local input/output line coupled to the first sense amplifier via a first column transistor, and the second channel includes a second sense amplifier amplifying data read from the second memory cell array, a second assist amplifier coupled between the second main input/output line and a second local input/output line coupled to the second sense amplifier via a second column transistor.

6. The semiconductor apparatus as claimed in claim 4, wherein the mesh structure lines are connected electrically to the first and second main amplifiers.

7. The semiconductor apparatus as claimed in claim 4, wherein the first power supply pad, the first clock pad, the first command address pad and the first data input/output pad are aligned along a first edge of the semiconductor apparatus, and the second power supply pad, the second clock pad, the second command address pad and the second data input/output pad are aligned along a second edge of the semiconductor apparatus opposite to the first edge.

8. The semiconductor apparatus as claimed in claim 4, wherein an area between the first main amplifier and the second main amplifier is free from the first and second main input/output lines.

9. A semiconductor apparatus comprising:
   a plurality of first pads including a first power supply pad and a first data input/output pad, the plurality of first pads aligned to a first line elongated in a first direction;
   a plurality of second pads including a second power supply pad and a second data input/output pad, the plurality of second pads aligned to a second line elongated in the first direction;
   first and second memory cell arrays arranged between the plurality of first pads and the plurality of second pads in a second direction crossing the first direction;
   a first main amplifier arranged between the first memory cell array and the plurality of first pads;
   a second main amplifier arranged between the second memory cell array and the plurality of second pads;
   a first data input/output circuit coupled between the first data input/output pad and the first main amplifier;
   a second data input/output circuit coupled between the second data input/output pad and the second main amplifier;
   a first signal line coupled between the first main amplifier and the first data input/output circuit;
   a second signal line coupled between the second main amplifier and the second data input/output circuit; and
   a primary power supply line arranged between the first and second main amplifiers;
   wherein the first signal line extends along the second direction from an edge of the primary power supply line, and is sandwiched between a pair of shielding power supply lines that extend in the second direction along opposing surfaces of the first signal line; and
   wherein a width of the primary power supply line is wider than a width of the first signal line.

10. The semiconductor apparatus as claimed in claim 9, wherein at least a part of the primary power supply line is in a same wiring layer as the first and second signal lines.

11. The semiconductor apparatus as claimed in claim 9, wherein the shielding power supply lines and the first signal line are in a same wining layer.

12. The semiconductor apparatus as claimed in claim 9, wherein the primary power supply line passes above the first and second memory cell arrays.

* * * * *